(12) United States Patent
Shimizu et al.

(10) Patent No.: US 9,310,789 B2
(45) Date of Patent: Apr. 12, 2016

(54) COMPONENT VERIFICATION METHOD AND COMPONENT VERIFICATION SYSTEM

(71) Applicant: PANASONIC INTELLECTUAL PROPERTY MANAGEMENT CO., LTD., Osaka (JP)

(72) Inventors: Junkei Shimizu, Yamanashi (JP); Kazunori Kanai, Yamanashi (JP); Tatsuo Yamamura, Fukuoka (JP); Kenji Kamakura, Yamanashi (JP)

(73) Assignee: PANASONIC INTELLCTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/605,478

(22) Filed: Jan. 26, 2015

(65) Prior Publication Data

US 2015/0212503 A1    Jul. 30, 2015

(30) Foreign Application Priority Data

Jan. 27, 2014   (JP) ................................. 2014-012040

(51) Int. Cl.
*G06F 17/00*   (2006.01)
*G05B 15/02*   (2006.01)

(52) U.S. Cl.
CPC ..................................... *G05B 15/02* (2013.01)

(58) Field of Classification Search
USPC .................................. 235/375, 451, 488, 492
See application file for complete search history.

(56) References Cited

U.S. PATENT DOCUMENTS

| | | | |
|---|---|---|---|
| 8,111,137 B2* | 2/2012 | Nagai et al. | 340/10.1 |
| 2003/0225547 A1* | 12/2003 | Paradies | H05K 13/08 |
| | | | 702/150 |
| 2004/0039480 A1* | 2/2004 | Kou | 700/222 |
| 2005/0036274 A1* | 2/2005 | Suhara et al. | 361/600 |
| 2005/0165505 A1* | 7/2005 | Moriya | H05K 13/08 |
| | | | 700/121 |
| 2006/0220859 A1* | 10/2006 | Nagai et al. | 340/572.1 |
| 2009/0031559 A1* | 2/2009 | Kawabata | H05K 13/0452 |
| | | | 29/743 |
| 2010/0078486 A1* | 4/2010 | Kai et al. | 235/492 |
| 2011/0243695 A1 | 10/2011 | Hwang et al. | |

FOREIGN PATENT DOCUMENTS

| | | |
|---|---|---|
| JP | 2011-211169 A | 10/2011 |
| WO | WO 2006126465 A1 * | 11/2006 |

* cited by examiner

*Primary Examiner* — Tuyen K Vo
(74) *Attorney, Agent, or Firm* — Pearne & Gordon LLP

(57) ABSTRACT

A component verification method includes a component ID reading process of reading a component ID corresponding to a stored component of a subsequent tape, a tape insertion detecting process of detecting that the subsequent tape has been inserted into a tape feeder, a feeder specifying process of specifying a tape feeder in which the insertion of the subsequent tape has been detected, a component verifying process of verifying whether or not a correspondence relationship between the read component ID and the specified tape feeder is correct, and a re-verification requesting process of requesting re-execution of the verification to a worker if it is detected that the subsequent tape has fallen from the tape feeder after the component verifying process.

6 Claims, 12 Drawing Sheets

COMPONENT VERIFICATION METHOD AND COMPONENT VERIFICATION SYSTEM

CROSS REFERENCE TO RELATED APPLICATION(S)

The present disclosure relates to the subject matters contained in Japanese Patent Application No. 2014-012040 filed on Jan. 27, 2014, which are incorporated herein by reference in its entirety.

FIELD

One or more embodiments of the present invention relate to a component verification method and a component verification system that verify whether or not stored components of a subsequent tape subsequently inserted into a component mounting apparatus for component replenishment is correct.

BACKGROUND

Tape feeders are known as component supply devices in component mounting apparatuses. The tape feeders pitch-feed carrier tapes holding electronic components, thereby supplying the electronic components to component suction positions taken by a mounting head. As a method of continuing component supply continuously without stopping a mounting operation in the tape feeders, the tape splicing of connecting a new subsequent carrier tape (subsequent tape) to a trailing end portion of a preceding carrier tape (preceding tape) that is already mounted has been used in the related art. In this tape splicing method, a worker needs to execute complicated tape splicing work for every tape replenishment, and it is desired to reduce this workload. For this reason, a splicingless type tape feeder in which a subsequent tape is set at the tape feeder without performing the tape splicing work is used as a new tape replenishment method (for example, refer to below-described Patent Document 1).

In the related art shown in Patent Document 1, there is used a configuration in which component feed drive units each configured to drive a sprocket with a drive motor are respectively arranged at a tape insertion unit provided at a rear end portion of the tape feeder and a pickup unit that sends a carrier tape to component pickup positions, and the preceding tape and the subsequent tape are individually moved. By virtue of this configuration, tape supply is performed without connecting the preceding tape and the subsequent tape.

Patent Document 1 is JP-A-2011-211169.

SUMMARY

However, in the related art including the example of the above-described Patent Document, there is a difficulty in that the following malfunctions occur when a carrier tape is continuously supplied to the tape feeder by the splicingless method. Namely, in the splicingless method, the preceding tape and the subsequent tape are not connected integrally with each other. Therefore, if an external force is exerted on the subsequent tape due to the worker's unsuitable operation after the mounting of the subsequent tape, there is a case where a malfunction in which the subsequent tape in the mounted state falls from the sprocket occurs.

In such a case, the worker performs the work of making an access to the component supply unit and re-mounting the tape feeder from which the subsequent tape has fallen. However, since a number of tape feeders having the same shape are arranged adjacent to each other in the component supply unit, a work error in which the worker erroneously mounts the subsequent tape on an adjacent tape feeder in this re-mounting work may occur. In the related art, there is no technique of detecting such a work error caused by a worker's carelessness. If the work continues as it is, incorrect components may be supplied and malfunctions, such as an apparatus stop and a mounting error, may occur.

Thus, an object of the embodiments of the invention is to provide a component verification method and a component verification system that can prevent malfunctions resulting from a work error in re-mounting of a fallen subsequent tape.

According to the embodiments of the invention, there is provided a component verification method for verifying whether or not a stored component of a subsequent tape subsequently inserted into a tape feeder, in a state where a preceding tape precedingly sent out of two carrier tapes sequentially sent one after another is mounted, for component replenishment is correct, in a component mounting apparatus that picks up components, which are supplied from carrier tapes tape-fed by a plurality of tape feeders arrayed in a component supply unit, by a mounting head to mount the components on a substrate, the component verification method including: a component ID reading process of reading a component ID corresponding to the stored component of the subsequent tape; a tape insertion detecting process of detecting that the subsequent tape has been inserted into the tape feeder; a feeder specifying process of specifying a tape feeder in which the insertion of the subsequent tape has been detected; a component verifying process of verifying whether or not a correspondence relationship between the read component ID and the specified tape feeder is correct; and a re-verification requesting process of requesting re-execution of the verification to a worker if it is detected that the subsequent tape has fallen from the tape feeder after the component verifying process.

According to the embodiments of the invention, there is provided a component verification system for verifying whether or not stored components of a subsequent tape subsequently inserted into a tape feeder, in a state where a preceding tape precedingly sent out of two carrier tapes sequentially sent one after another is mounted, for component replenishment is correct, in a component mounting apparatus that picks up components, which are supplied from carrier tapes tape-fed by a plurality of tape feeders arrayed in a component supply unit, by a mounting head to mount the components on a substrate, the component verification system including: a component ID reading unit that reads a component ID corresponding to the stored component of the subsequent tape; a tape insertion detecting unit that detects that the subsequent tape has been inserted into the tape feeder; a feeder specifying unit that specifies a tape feeder in which the insertion of the subsequent tape has been detected; a component verifying unit that verifies whether or not a correspondence relationship between the read component ID and the specified tape feeder is correct; and a re-verification requesting unit that requests re-execution of the verification to a worker if it is detected that the subsequent tape has fallen from the tape feeder after the verification.

According to the embodiments, malfunctions resulting from a work error in re-mounting of a fallen subsequent tape can be prevented.

BRIEF DESCRIPTION OF THE DRAWINGS

A general configuration that implements the various features of the invention will be described with reference to the drawings. The drawings and the associated descriptions are provided to illustrate embodiments of the invention and should not limit the scope of the invention.

DETAILED DESCRIPTION OF THE EMBODIMENTS

Next, an embodiment of the invention will be described with reference to the drawings. First, the configuration of a component mounting apparatus 1 that mounts electronic components on a substrate will be described with reference to FIGS. 1 and 2. The component mounting apparatus 1 has a function of mounting electronic components, such as semiconductor chips, on the substrate, and FIG. 2 partially illustrates an A-A cross section in FIG. 1.

Figure 1:
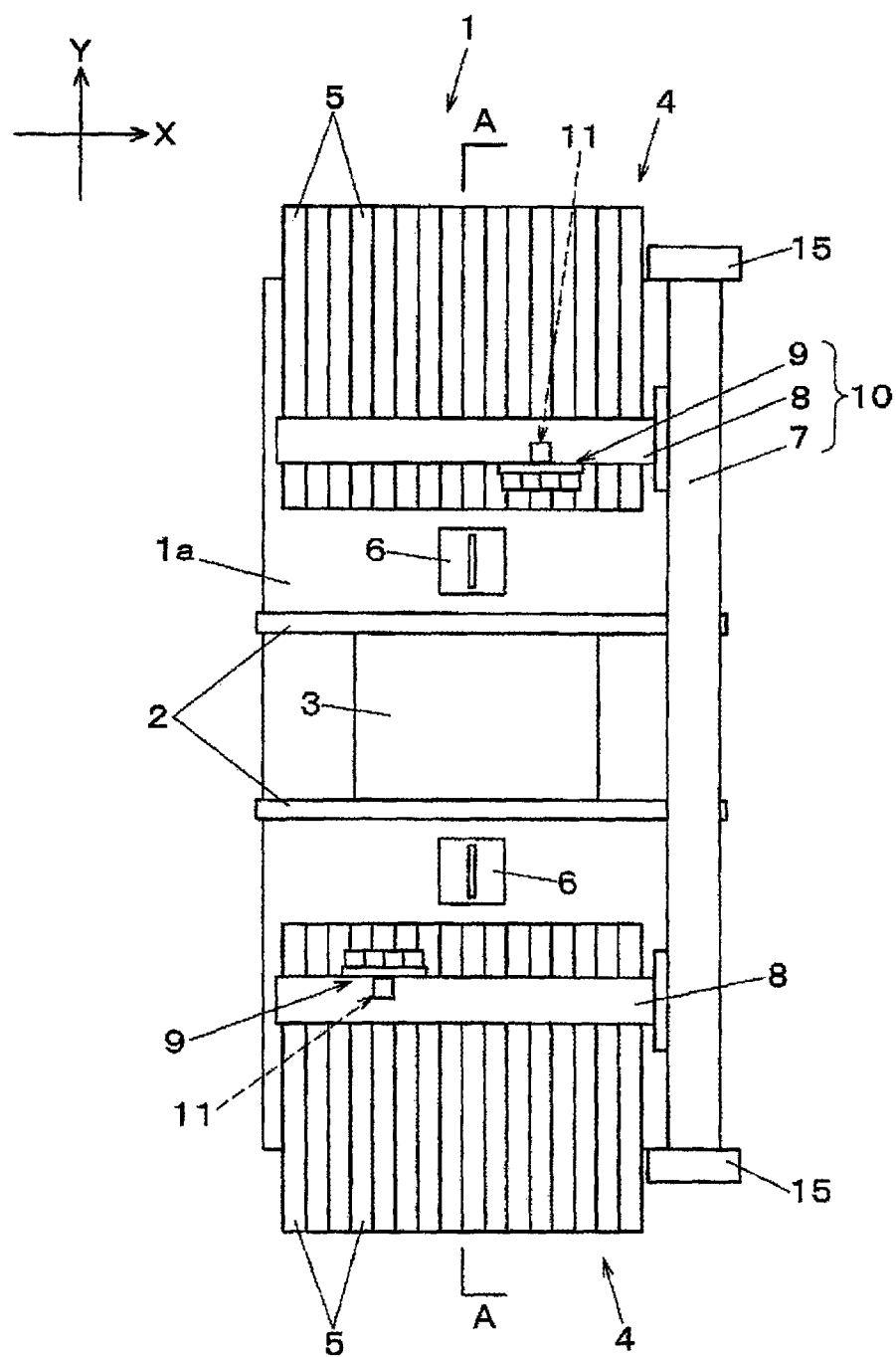
FIG. 1 is a plan view of a component mounting apparatus of an embodiment of the invention.

In FIG. 1, a substrate conveying mechanism 2 is disposed in an X direction (substrate conveying direction) at the center of a base 1a. The substrate conveying mechanism 2 conveys a substrate 3 carried in from the upstream side, and positions and holds the substrate on a mounting stage set in order to execute component mounting work. Component supply units 4 are arranged on both lateral sides of the substrate conveying mechanism 2, and a plurality of tape feeders 5 are mounted in parallel on each component supply unit 4. The tape feeder 5 pitch-feeds a carrier tape, which has stored electronic components, in a tape feed direction, that is, in a direction directed to the substrate conveying mechanism 2 from the outside of the component supply unit 4, thereby supplying the electronic components to component suction positions taken by a mounting head of a component mounting mechanism to be described below.

Figure 2:
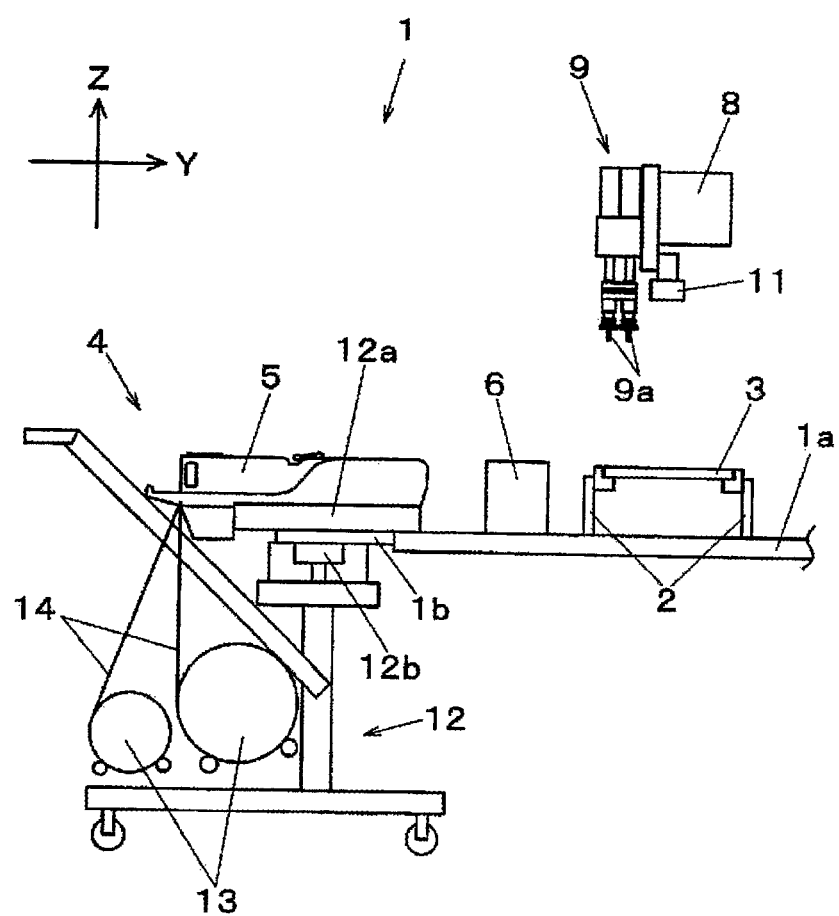
FIG. 2 is a partial cross-sectional view of the component mounting apparatus of the embodiment of the invention.

A Y-axis movable table 7 including a linear driving mechanism is disposed in a Y direction orthogonal to an X direction at an end portion on one side in the X direction on an upper surface of the base 1a, and two X-axis movable tables 8 similarly including linear driving mechanisms are coupled to the Y-axis movable table 7 so as to be movable in the Y direction. Mounting heads 9 are mounted on the two X-axis movable tables 8, respectively, so as to be movable in the X direction. The mounting head 9 is a multiple head including a plurality of holding heads, and as illustrated in FIG. 2, suction nozzles 9a capable of suctioning, holding, and individually lifting an electronic component are mounted on a lower end portion of each holding head.

By driving the Y-axis movable table 7 and the X-axis movable tables 8, the mounting heads 9 move in the X direction and in the Y direction. Accordingly, the two mounting heads 9 suction, hold, and take out electronic components from the component suction positions of the tape feeders 5 of the component supply units 4 corresponding thereto, respectively, by the suction nozzles 9a, and transfer and load the electronic components to the mounting points of the substrate 3 positioned on the substrate conveying mechanism 2. The Y-axis movable table 7, the X-axis movable table 8, and the mounting head 9 constitute a component mounting mechanism that moves the mounting head 9 holding an electronic component, thereby transferring and loading the electronic component to the substrate 3.

A component recognition camera 6 is disposed between each component supply unit 4 and the substrate conveying mechanism 2. When the mounting head 9 that has taken out an electronic component from the component supply unit 4 moves above the component recognition camera 6, the component recognition camera 6 images and recognizes the electronic component in a state where the electronic component is held by the mounting head 9. A substrate recognition camera 11, which is located on a lower surface side of the X-axis movable table 8 and moves integrally with the mounting head 9, is mounted on the mounting head 9.

As the mounting head 9 moves, the substrate recognition camera 11 moves above the substrate 3 positioned on the substrate conveying mechanism 2, and images and recognizes the substrate 3. In the component mounting operation to the substrate 3 performed by the mounting head 9, a recognition result of an electronic component obtained by the component recognition camera 6 and a substrate recognition result obtained by the substrate recognition camera 11 are considered, and loading position correction is performed. Display units including display screens, such as liquid crystal panels, are arranged on both side surfaces of the component mounting apparatus 1. An operation screen for operation input and various notification screens are displayed on each display unit 15.

As illustrated in FIG. 2, a carriage 12 in a state where a plurality of tape feeders 5 is mounted in advance on a feeder base 12a is set at the component supply unit 4. Feeder addresses for specifying feeder positions where the respective tape feeders 5 are mounted are set in the feeder base 12a, and in the component mounting work, the respective tape feeders 5 in the feeder base 12a are specified via these feeder addresses.

By clamping a feeder base 12a to a fixing base 1b provided in the base 1a with a clamp mechanism 12b, the position of the carriage 12 is fixed in the component supply unit 4. A supply reel 13 that stores a carrier tape 14 that has held electronic components in a wound state is held by the carriage 12. The carrier tape 14 pulled out from the supply reel 13 is pitch-fed to component suction positions taken by the suction nozzles 9a by the tape feeder 5.

Figure 3:
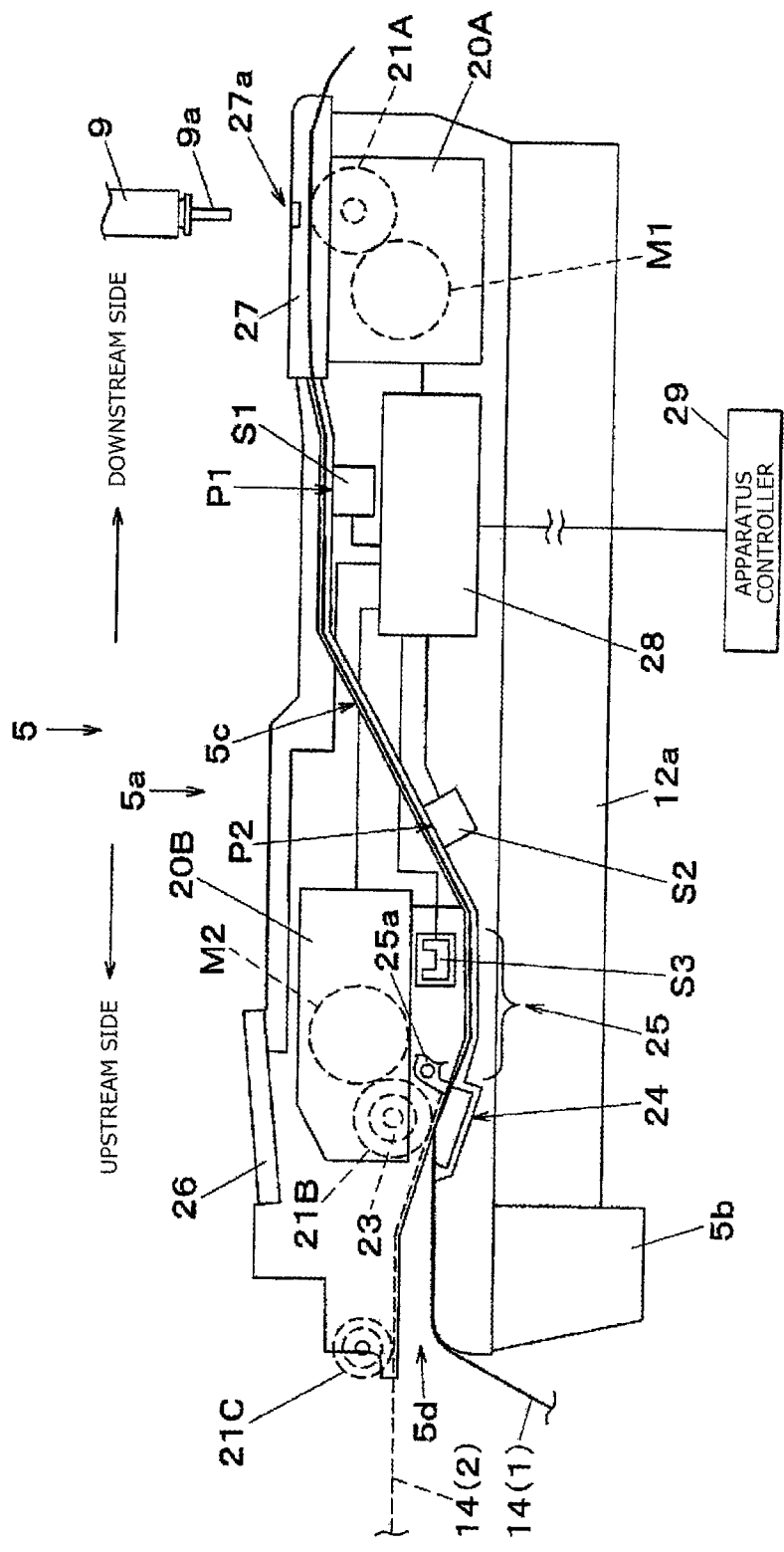
FIG. 3 is a configuration explanatory view of a tape feeder of the embodiment of the invention.

Next, the configuration and functions of the tape feeder 5 will be described with reference to FIG. 3. As illustrated in FIG. 3, the tape feeder 5 has a configuration including a body portion 5a and a mounting portion 5b provided to protrude downward from a lower surface of the body portion 5a. The tape feeder 5 is fixed to and mounted on the component supply unit 4 in a state where the tape feeder 5 is mounted such that the lower surface of the body portion 5a runs along the feeder base 12a, and a feeder controller 28 built in to control tape feed in the tape feeder 5 is electrically connected to an apparatus controller 29 of the component mounting apparatus 1.

A tape traveling path 5c along which the carrier tape 14 is pulled out from the supply reel 13 and taken into the body portion 5a is provided inside the body portion 5a. The tape traveling path 5c is provided so as to communicate from a tape introduction port 5d opening to an upstream end portion in the tape feed direction in the pitch feeding in the body portion 5a to component suction positions where electronic components are taken out by the mounting head 9. In the process of continuously executing the component mounting work, a plurality of carrier tapes 14 having the amount of a tape to be stored in one supply reel 13 as a unit lot are sequentially inserted from the tape introduction port 5d and are supplied to the tape feeder 5.

In the component mounting apparatus 1 illustrated in the present embodiment, there is adopted a splicingless method in which, out of two carrier tapes 14 that are introduced from the tape introduction port 5d and sent one after another, a trailing end portion of a carrier tape 14(1) (hereinafter abbreviated as a preceding tape 14(1)) that is already mounted on the tape feeder 5 and serves as a component extraction target by the mounting head 9 and a leading end portion of a carrier tape 14(2) (hereinafter abbreviated as a subsequent tape 14(2)) that is newly added and mounted in the case of a component shortage are sequentially inserted and supplied into the tape introduction ports 5d while remaining separated, respectively, without performing the tape splicing of joining these tapes together using a joining tape.

A sprocket 21C with which the subsequent tape 14(2) to be additionally mounted is engaged is disposed above the tape introduction port 5d. The sprocket 21C has a function of regulating the tape feed direction of the subsequent tape 14(2), thereby preventing falling of the subsequent tape 14(2). A first tape feed mechanism 20A and a second tape feed mechanism 20B for feeding the preceding tape 14(1) and the subsequent tape 14(2) are disposed on a downstream side and on an upstream side in the tape traveling path 5c.

The second tape feed mechanism 20B provided on the upstream side has a function of feeding the subsequent tape 14(2) to be newly mounted continuously from a tape introduction port 5d side to a first tape feed mechanism 20A side, and has a configuration in which a sprocket 21B is rotationally driven by a second motor M2. A tape pressing mechanism 24 and a tape stopper mechanism 25 are disposed below the second tape feed mechanism 20B. The subsequent tape 14(2) introduced into the tape introduction port 5d via the sprocket 21C is pressed against the sprocket 21B by the tape pressing mechanism 24, and thereby, the subsequent tape 14(2) is engaged with the sprocket 21B and is brought into a state where the tape feed performed by the second tape feed mechanism 20B is allowed. The tape stopper mechanism 25 has a function of temporarily stopping the leading end portion of the subsequent tape 14(2) newly inserted in a state where the preceding tape 14(1) is mounted, by a stopper member 25a.

The first tape feed mechanism 20A provided on the downstream side has a function of pitch-feeding the preceding tape 14(1) to the component suction positions taken by the mounting head 9 at a predetermined feeding pitch, and has a configuration in which a sprocket 21A is rotationally driven by a first motor M1. A pressing member 27 that holds down the preceding tape 14(1) from above and exposes a component stored in the preceding tape 14(1) is mounted above the first tape feed mechanism 20A, and electronic components pitch-fed to the component suction positions are picked up through vacuum suction by the suction nozzles 9a of the mounting head 9 via a component extraction opening 27a formed in the pressing member 27.

Figure 4A:
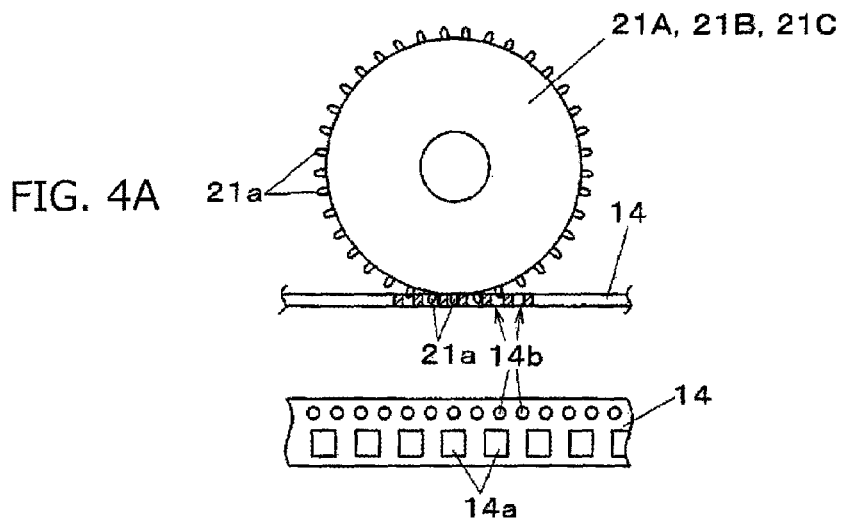
FIGS. 4A to 4D are functional explanatory views of a sprocket used for a tape feed mechanism in the tape feeder of the embodiment of the invention.

Here, the functions of the sprockets 21A, 21B, and 21C will be described with reference to FIGS. 4A to 4D. As illustrated in FIG. 4A, a plurality of feed pins 21a are provided on outer peripheral surfaces of the sprockets 21A, 21B, and 21C. Feed holes 14b into which the feed pins 21a are fitted, together with the component pockets 14a that store electronic components serving as supply targets, are formed at predetermined pitches in the carrier tape 14. As the sprockets 21A and 21B rotate in a state where the feed pins 21a are engaged with the feed holes 14b, the carrier tape 14 is tape-fed.

Figure 4B:
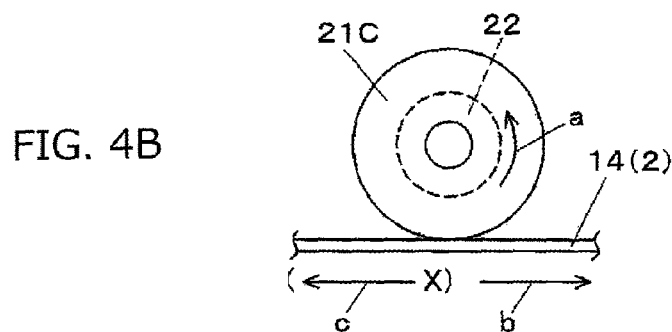

FIG. 4B illustrates the function of the sprocket 21C. A one-way clutch mechanism 22 that permits rotation only in a rotational direction (arrow a) corresponding to the tape feed direction from the upstream side to the downstream side (arrow b) and prohibits rotation in an opposite direction (arrow c) is built into the sprocket 21C. Accordingly, the movement of the subsequent tape 14(2) in a normal tape feed direction (arrow b) is performed and the movement thereof in an opposite direction (arrow c) is prohibited, in a state where the subsequent tape 14(2) is engaged with the sprocket 21C. Accordingly, even when an external force in a pulling-out direction is exerted on the subsequent tape 14(2) due to unsuitable handling or the like of a worker in a state where the subsequent tape 14(2) is newly mounted for component supply, the subsequent tape 14(2) is locked by the sprocket 21C, and falling from the tape feeder 5 is prevented.

Figure 4C:
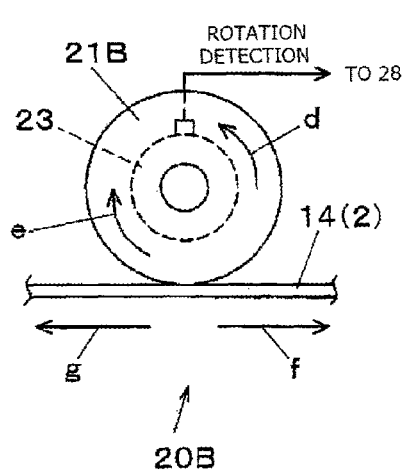

FIG. 4C illustrates the function of the sprocket 21B in the second tape feed mechanism 20B. As mentioned above, the sprocket 21B is rotationally driven by the second motor M2, thereby continuously feeding the subsequent tape 14(2). In this drive method, the idling of the sprocket 21B is permitted and the movement of the subsequent tape 14(2) in the state of being engaged with the sprocket 21B is also permitted, in a deenergized state where the driving of the second motor M2 is not drive controlled.

An encoder 23 serving as rotation detecting means is built into the sprocket 21B. If the subsequent tape 14(2) moves in a downstream direction (arrow f) and in an upstream direction (arrow g), the sprocket 21B rotates in a normal direction (arrow d) and in a reverse direction (arrow e), respectively, and rotation detection signals according to these rotation states are transmitted to the feeder controller 28. In the present embodiment, the state of the subsequent tape 14(2) in the second tape feed mechanism 20B is determined by monitoring the rotation detection signals transmitted to the feeder controller 28.

First, if the rotation of the sprocket 21B in the normal direction (direction of arrow d) is detected, it is determined that a new carrier tape 14 has been inserted, and the driving of the second motor M2 for tape feed is started. Accordingly, the inserted carrier tape 14 is sent to the downstream side along the tape traveling path 5c. Additionally, if the rotation of the sprocket 21B in the reverse direction (direction of arrow e) is detected after the rotation of the sprocket in the normal direction (direction of arrow d) is detected, it is determined that the carrier tape 14 that has been previously inserted and engaged with the sprocket 21B has moved in a falling direction (direction of arrow g) due to a certain cause, and tape falling determination is made.

Figure 4D:
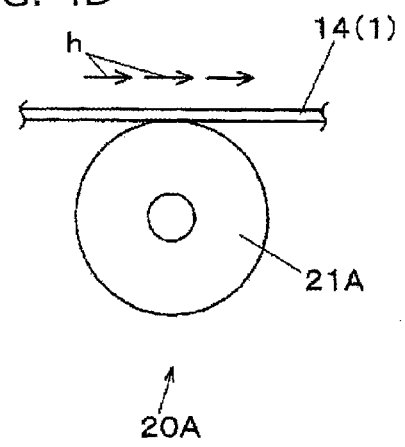

FIG. 4D illustrates the function of the sprocket 21A in the first tape feed mechanism 20A. As mentioned above, the sprocket 21A is intermittently driven by the first motor M1, thereby pitch-feeding (arrow h) the preceding tape 14(1) at predetermined feeding pitches. Accordingly, the electronic components stored within the component pockets 14a of the carrier tape 14 are supplied to the component suction positions taken by the mounting head 9.

A first detection position P1 for detecting the carrier tape 14 is set on the upstream side of the first tape feed mechanism 20A in the tape traveling path 5c, and a second detection position P2 for detecting the carrier tape 14 is similarly set on the downstream side of the second tape feed mechanism 20B and on the upstream side of the first detection position P1. A first sensor S1 and a second sensor S2 disposed at the first detection position P1 and the second detection position P2, respectively, detect the presence/absence of the carrier tape 14 at the first detection position P1 and the second detection position P2. Moreover, a third sensor S3 that detects that the subsequent tape 14(2) abuts against the stopper member 25a is disposed at the tape stopper mechanism 25.

The detection results obtained by the first sensor S1, the second sensor S2, and the third sensor S3 are transmitted to the feeder controller 28, and the feeder controller 28 controls the first tape feed mechanism 20A and the second tape feed mechanism 20B based on these detection results and the rotation detection result obtained by the encoder 23. Accordingly, the tape feed operation of the preceding tape 14(1) and the subsequent tape 14(2) in the tape feeder 5 is executed. Additionally, an operation and display panel 26 arranged on an upper surface on the upstream side of the tape feeder 5 is connected to the feeder controller 28.

Figure 5:
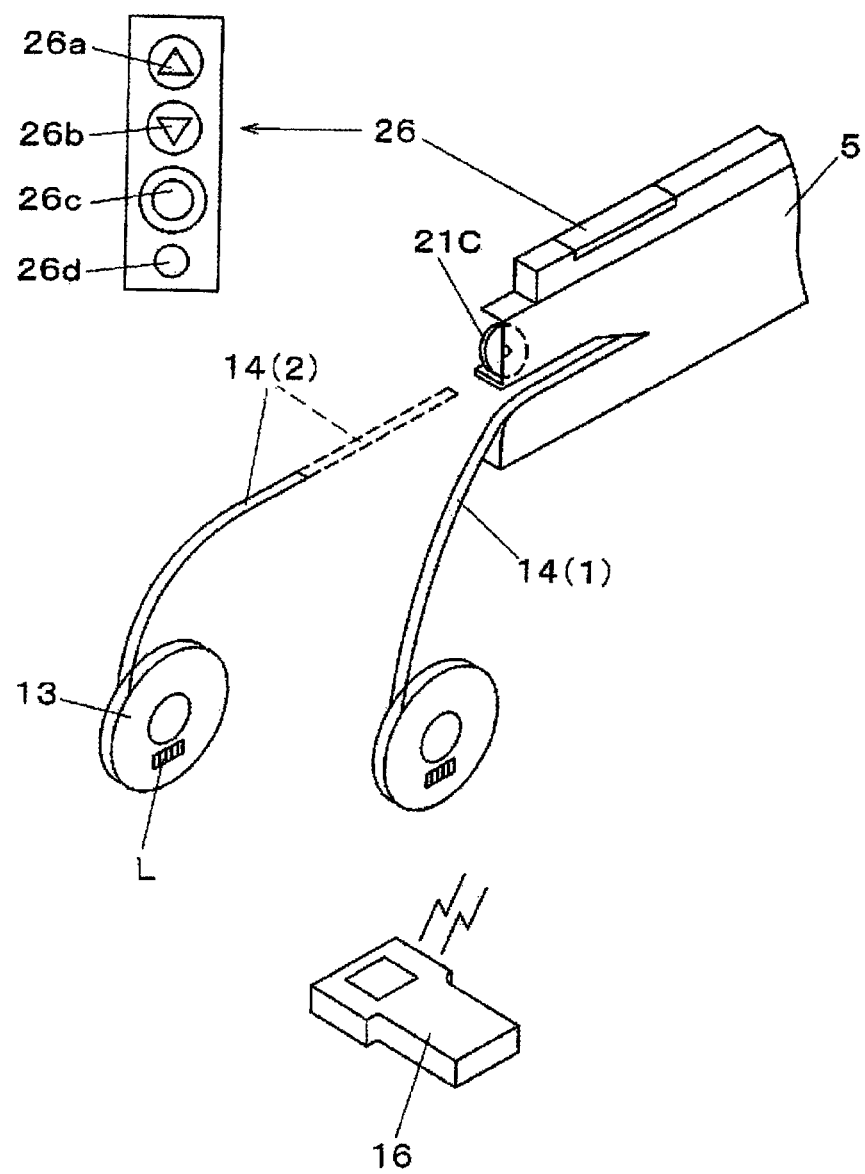
FIG. 5 is an explanatory view of component ID reading in the tape feeder of the embodiment of the invention.

As illustrated in FIG. 5, the operation and display panel 26 is provided with a tape feed button 26a, a tape return button 26b, an operation button 26c, and a notification lamp 26d. The tape feed operation and tape return operation of the first tape feed mechanism 20A and the second tape feed mechanism 20B of the tape feeder 5 can be performed by operating the tape feed button 26a and the tape return button 26b. The operation button 26c performs various kinds of operations, such as selection of the first tape feed mechanism 20A and the second tape feed mechanism 20B, and component ID writing to a built-in memory (refer to a feeder storage unit 36 illustrated in FIG. 6B) of the tape feeder 5. The notification lamp 26d is an LED signal lamp for notification, and performs notification based on preset predetermined items. Notification during the component verification processing of verifying whether or not stored components of the subsequent tape 14(2) subsequently inserted for component replenishment to be described below are correct is included in targets for this notification.

FIG. 5 illustrates component replenishment work for inserting the subsequent tape 14(2) into the tape feeder 5 in a state where the preceding tape 14(1) out of the two carrier tapes 14 sent one after another is mounted. In this component replenishment work, the worker prepares a supply reel 13 corresponding to stored components serving as replenishment targets. Then, in order to verify whether or not the stored components of the prepared supply reel 13 are a correct component type to be replenished, a bar code label L that is a component ID label patched in advance on the supply reel 13 for component type identification is read by a bar code reader 16 (component ID reading unit).

The reading result is transmitted to a host system 30 via a wireless receiving device 31 (refer to FIGS. 6A and 6B), and is further transmitted from the host system to the component mounting apparatus 1. Then, the component verification processing between component arrangement data 32b (refer to FIG. 6A) (to be described below) included in production data that the component mounting apparatus 1 has downloaded from the host system 30, and a component ID read by the bar code reader 16 is performed. Then, if the read component ID is correct, the component mounting apparatus 1 turns on the notification lamp 26d of the operation and display panel 26 of the tape feeder into which the subsequent tape 14(2) is inserted, and visually notifies the fact to the worker. In response to this information, the worker inserts the carrier tape 14 pulled out from the prepared supply reel 13 into the tape feeder 5 as the subsequent tape 14(2).

Next, the configuration of the component mounting apparatus 1 and a control system of the component verification system that verifies whether or not the stored components of the subsequent tape 14(2) subsequently inserted into the tape feeder 5, in a state where the preceding tape 14(1) is mounted, for component replenishment in the component mounting apparatus 1 is correct will be described with reference to FIGS. 6A and 6B. In addition, FIG. 6A illustrates the overall configuration of the component verification system, and FIG. 6B illustrates the configuration of a plurality of the tape feeders 5 to be mounted on the component supply unit 4 of the component mounting apparatus 1 in the component verification system.

Figure 6A:
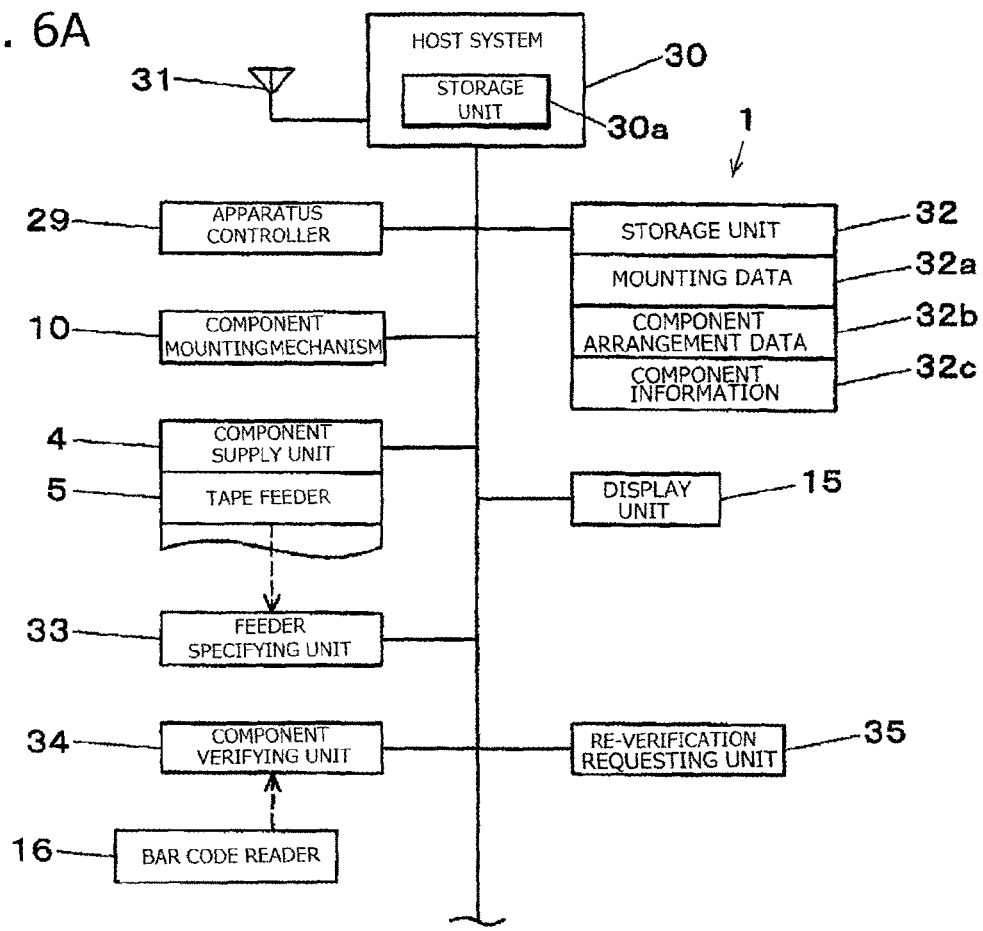
FIGS. 6A and 6B are block diagrams illustrating the configuration of a control system of a component verification system of the embodiment of the invention.
Figure 6B:
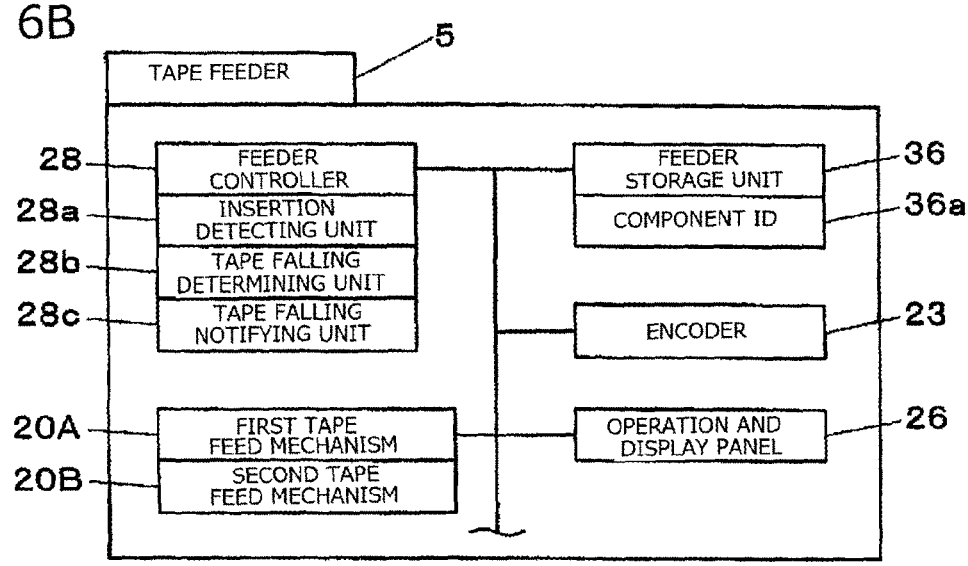

In FIG. 6A, the component mounting apparatus 1 is connected to the host system 30 via a LAN system (not illustrated). Various kinds of data, such as production data to be used for the component mounting work in the component mounting apparatus 1 are stored in a storage unit 30a provided in the host system 30. In the component mounting work performed by the component mounting apparatus 1, the production data is downloaded from the host system 30 and is stored in the storage unit 32, and the operation information of the component mounting apparatus 1 is collected by the host system 30. Additionally, the host system 30 includes the wireless receiving device 31 that receives signals from portable terminals, such as the bar code reader 16.

The apparatus controller 29 is an arithmetic processing unit including a CPU function, and executes a processing program stored in the storage unit 32, thereby controlling respective units of the component mounting mechanism 10, the component supply unit 4, and the display unit 15. During the control processing performed by the apparatus controller 29, various kinds of production data, such as mounting data 32a, the component arrangement data 32b, component information 32c, or the like, which are downloaded from the host system 30 and stored in the storage unit 32, are referred to.

The mounting data 32a is data of the component type of electronic components to be mounted, the mounting position coordinates of the substrate, or the like, and is stored for every substrate type that is a production target. The component arrangement data 32b is data that specifies the array of the tape feeders 5 in the component supply unit 4, that is, data in which the mounting positions of the tape feeders 5 and component IDs that are identification information that specifies components set in the tape feeders 5 are made to correspond to each other in the feeder base 12a. The component information 32c is data peculiar to a component type that specifies a component ID or a component size for each component and the details of the tape feed operation in each tape feeder 5.

The feeder specifying unit 33 specifies the mounting position of a tape feeder 5 in which the insertion of the subsequent tape 14(2) is detected by an insertion detecting unit 28a for the tape feeder 5 to be described below. The component verifying unit 34 performs the processing of verifying whether or not the correspondence relationship between the component ID read by the bar code reader 16 and the tape feeder 5 specified by the feeder specifying unit 33, that is, a tape feeder 5 into which the insertion of the subsequent tape 14(2) is detected, is correct. Accordingly, it is confirmed whether or not the correspondence relationship between the component ID specified in the component arrangement data 32b and the feeder address is correctly observed.

The re-verification requesting unit 35 performs the processing of requesting re-execution of the verification processing of the worker if the insertion detecting unit 28a for the tape feeder 5 to be described below detects that the subsequent tape 14(2) has fallen from the tape feeder 5 after the component verification processing is executed by the component verifying unit 34. That is, when tape falling has been detected, in order to prevent an occurrence of a work error accompanying re-insertion as well as the work of re-inserting the fallen subsequent tape 14(2), the worker is forced to perform repetitive execution of the component verification processing. In addition, although a configuration example in which the component verifying unit 34 and the re-verification requesting unit 35 are provided as the processing functions of the component mounting apparatus 1 is illustrated herein, these processing functions may be provided as the processing functions of the host system 30.

The display unit 15 displays various kinds of screens required for the execution of the component mounting work by the component mounting apparatus 1. A notification screen that visually displays various kinds of information items in the execution of component verification processing and a work instruction screen are included in these display screens (refer to FIG. 10). Accordingly, the display unit 15 is a notification unit that visually notifies the above-mentioned items. In addition, as notification means to function as the visual notification unit, a configuration in which notification contents are transmitted with blink patterns specified in advance, such as an alarm lamp, may be adopted besides the display unit 15 that displays notification contents on a screen.

In FIG. 6B, the feeder controller 28 controls the first tape feed mechanism 20A and the second tape feed mechanism 20B. This control is performed based on a control signal from the component mounting apparatus 1, an operation input from the operation and display panel 26, and a signal from the encoder 23 built into the sprocket 21B. The feeder controller 28 includes the insertion detecting unit 28a, a tape falling determining unit 28b, and a tape falling notifying unit 28c as internal processing functions. The insertion detecting unit 28a detects that the subsequent tape 14(2) has been inserted into the tape feeder 5 based on the rotation detection result of the sprocket 21B by the encoder 23. The tape falling determining unit 28b determines that the subsequent tape 14(2) has fallen from the sprocket 21B of the second tape feed mechanism 20B, similarly based on the rotation detection result of the sprocket 21B by the encoder 23.

Figure 7A:
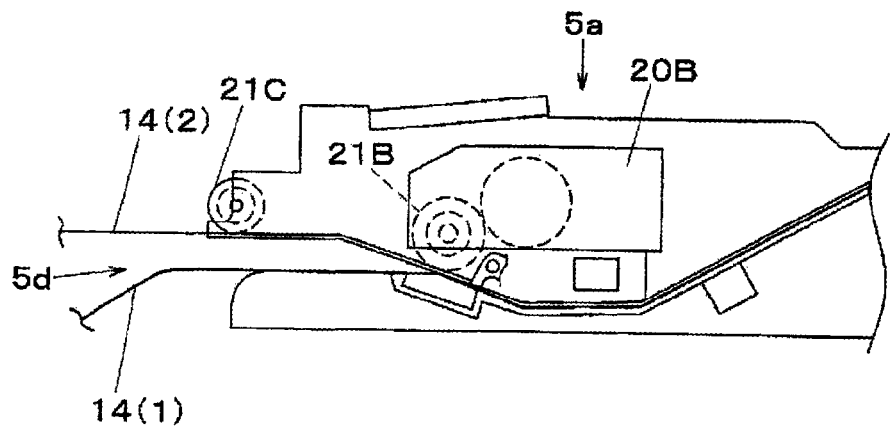
FIGS. 7A to 7C are explanatory views of tape insertion detection and falling determination in the tape feeder of the embodiment of the invention.
Figure 7B:
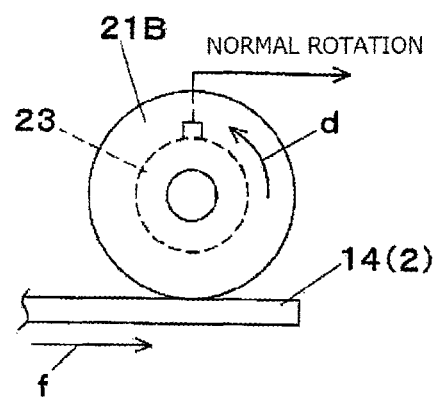

The insertion detection and the tape falling determination will be described with reference to FIGS. 7A to 7C. FIG. 7A illustrates a state where a new subsequent tape 14(2) is introduced via the sprocket 21C from the tape introduction port 5d and is engaged with the sprocket 21B, in a state where the preceding tape 14(1) is already mounted. During the mounting operation of the subsequent tape 14(2), the insertion detecting unit 28a monitors the rotation detection signal from the encoder 23 that is rotation detecting means, and as illustrated in FIG. 7B, determines that the subsequent tape 14(2) has been inserted from the tape introduction port 5d (arrow f), on the basis that the rotation of the sprocket 21B in the normal direction (arrow d) has been detected.

Accordingly, the encoder 23 and the insertion detecting unit 28a serve as a tape insertion detecting unit that detects that the subsequent tape 14(2) has been inserted into the tape feeder 5. Then, this tape insertion detecting unit detects the insertion of a subsequent tape, on the basis that a sprocket provided in a tape feed mechanism that feeds the subsequent tape rotates in accordance with the insertion of the subsequent tape 14(2).

In this tape insertion, although the subsequent tape 14(2) is held by the sprocket 21C, if a large external force is exerted due to an unsuitable operation or the like of the worker, a holding state cannot be maintained with only a holding force obtained by the sprocket 21C, and a malfunction in which the subsequent tape 14(2) separates from the sprocket 21B may occur. In the present embodiment, such tape separation is detected by a method to be described below and is notified to the worker.

Figure 7C:
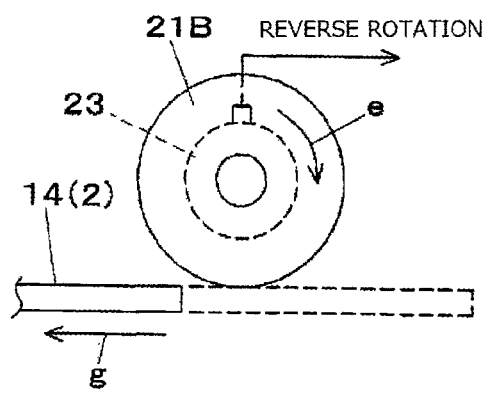

Namely, during the mounting operation of the subsequent tape 14(2), the tape falling determining unit 28b monitors the rotation detection signal from the encoder 23, and as illustrated in FIG. 7C, determines that the carrier tape 14(2), which was once inserted and engaged with the sprocket 21B, has been disengaged from the sprocket 21B, and moved and separated in the reverse direction (arrow g), on the basis that the rotation of the sprocket 21B, which is provided in the second tape feed mechanism 20B that feeds the subsequent tape 14(2), in the reverse direction (arrow e) has been detected. Accordingly, the encoder 23 and the tape falling determining unit 28b serve as a tape falling detecting unit that detects that the subsequent tape 14(2) has fallen from the tape feeder 5.

The tape falling notifying unit 28c notifies the tape falling determined by the tape falling determining unit 28b to the apparatus controller 29 of the component mounting apparatus 1. Then, the apparatus controller 29 notifies to the worker that the subsequent tape 14(2) has fallen, by the notification means, such as the display unit 15 provided in the component mounting apparatus 1. That is, the notification means, such as the tape falling notifying unit 28c and the display unit 15, serve as a tape falling notifying unit that notifies the fact that it is detected that the subsequent tape 14(2) has fallen.

Next, a component supply method in the component mounting apparatus 1 will be described with reference to FIGS. 8A to 8C and FIGS. 9A to 9C. This component supply is performed by sequentially feeding the plurality of carrier tapes 14 through the splicingless method in the tape feeder 5. FIGS. 8A to 8C and FIGS. 9A to 9C illustrate the process of feeding the preceding tape 14(1) sent precedingly and the subsequent tape 14(2) sent subsequently along the tape traveling path 5c out of the two carrier tapes 14 sent one after another.

Figure 8A:
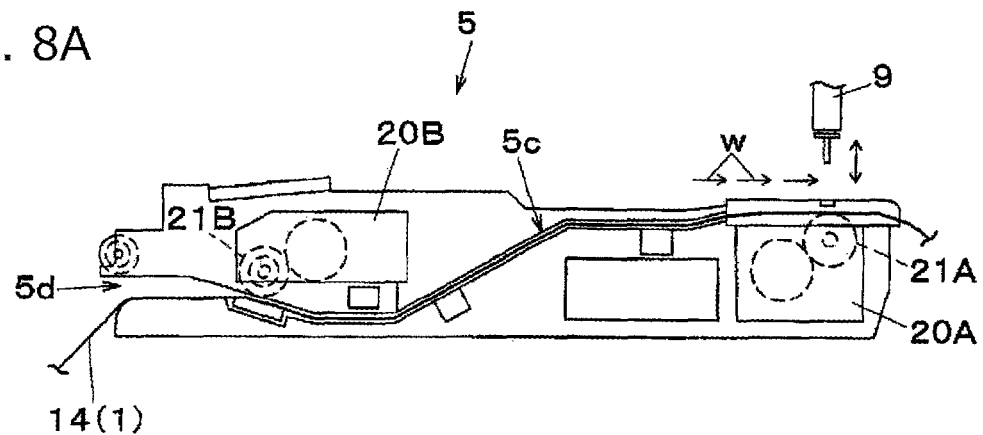
FIGS. 8A to 8C are process explanatory views of a tape feed method in the tape feeder of the embodiment of the invention.

First, FIG. 8A illustrates a state where the component mounting work is being executed while feeding the preceding tape 14(1) along the tape traveling path 5c. Namely, the preceding tape 14(1) is introduced into the tape feeder 5 via the tape introduction port 5d and is pitch-fed (arrow w) to the component suction positions by the first tape feed mechanism 20A (first tape feed process), and electronic components are taken out from the preceding tape 14(1) by the mounting head 9 at the component suction positions.

Figure 8B:
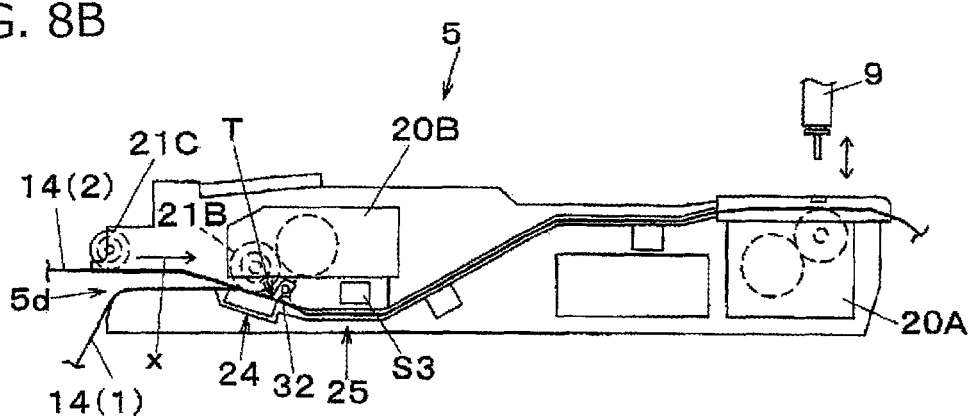

Next, if the supply of the components from the preceding tape 14(1) approaches the end in the process of continuously executing the component mounting work, as illustrated in FIG. 8B, the subsequent tape 14(2) is added and set for component replenishment. Namely, a leading portion of the subsequent tape 14(2) is introduced (arrow X) via the sprocket 21C disposed at the tape introduction port 5d and is inserted between the sprocket 21B and the preceding tape 14(1), in a state where the preceding tape 14(1) is engaged with the sprocket 21B of the second tape feed mechanism 20B by the tape pressing mechanism 24.

If the insertion of the subsequent tape 14(2) is detected, as the second tape feed mechanism 20B is driven, the subsequent tape 14(2) engaged with the sprocket 21B is sent to the downstream side, and the leading end portion T of the subsequent tape 14(2) abuts against and is stopped by the stopper member 25a of the tape stopper mechanism 25. That is, if the insertion of the subsequent tape 14(2) is detected, the sprocket 21B rotates by a predetermined amount, and pitch-feeds the subsequent tape 14(2) until the subsequent tape abuts against the stopper member 25a. Then, in this state, the subsequent tape 14(2) stands by, and the pitch feeding of the preceding tape 14(1) by the first tape feed mechanism 20A and the extraction of the electronic components by the mounting head 9 continue being executed.

Figure 8C:
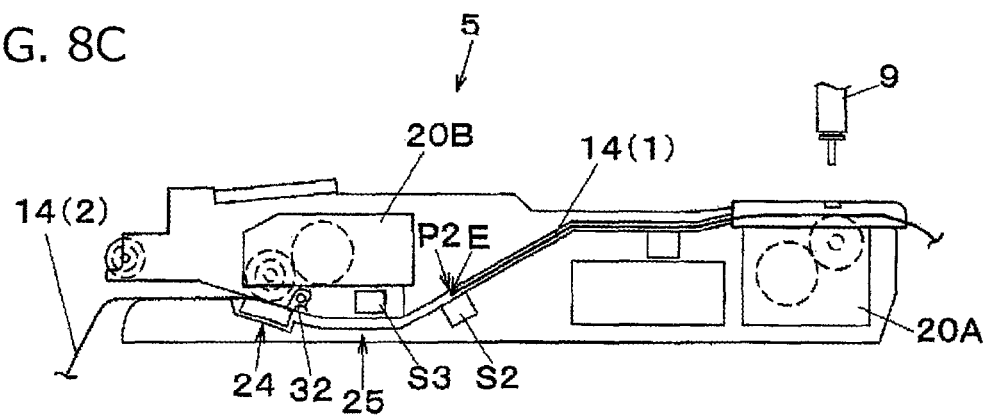

Thereafter, in the middle of the feeding of the preceding tape 14(1), as illustrated in FIG. 8C, the trailing end portion E of the preceding tape 14(1) is detected by the second sensor S2, and the detection result is transmitted to the feeder controller 28 (refer to FIGS. 6A and 6B). Then, the feeder controller 28 controls the first tape feed mechanism 20A and the second tape feed mechanism 20B based on a preset control pattern.

Figure 9A:
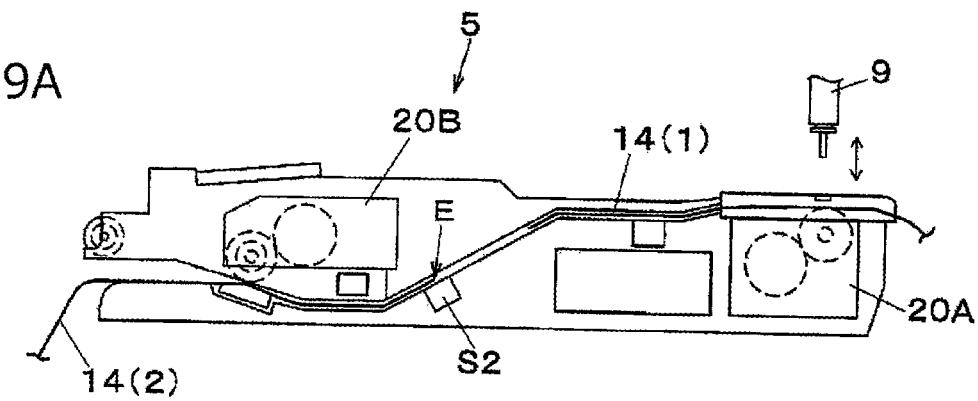
FIGS. 9A to 9C are process explanatory views of the tape feed method in the tape feeder of the embodiment of the invention.

Namely, if the trailing end portion E of the preceding tape 14(1) has been detected by the second sensor S2, the second tape feed mechanism 20B is driven to move the subsequent tape 14(2) in a state where the temporary stop performed by the stopper member 25a is already released so that the leading end portion T reaches the second detection position P2. Then, as illustrated in FIG. 9A, if the leading end portion T of the subsequent tape 14(2) is detected by the second sensor S2, the second tape feed mechanism 20B is stopped, and the subsequent tape 14(2) is made to stand by at this position. Then, in this state, the pitch feeding of the preceding tape 14(1) by the first tape feed mechanism 20A and the extraction of the electronic components by the mounting head 9 continue being executed.

Figure 9B:
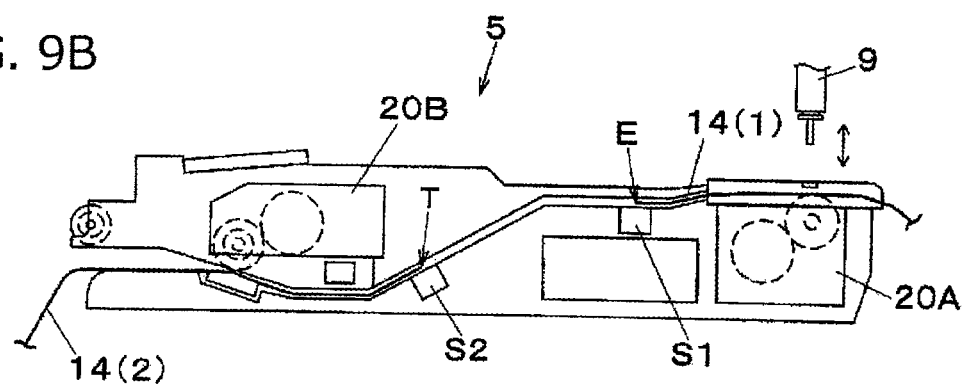
Figure 9C:
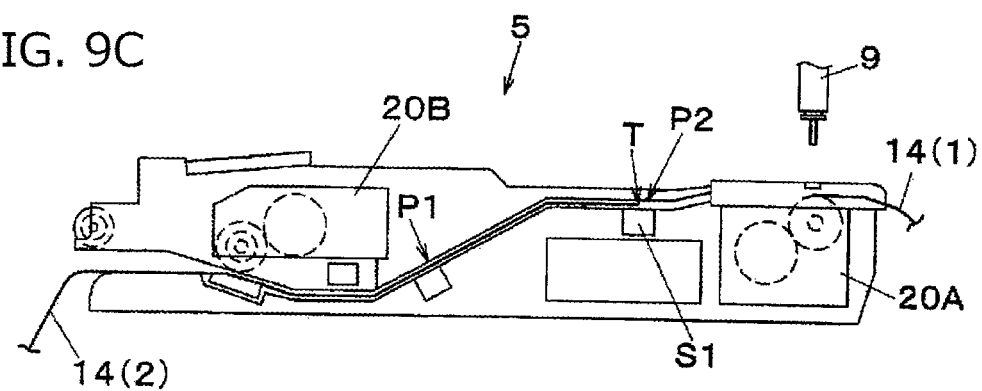

Moreover, if the trailing end portion E of the preceding tape 14(1) has been detected by the first sensor S1 as illustrated in FIG. 9B in the process of performing the pitch-feed of the preceding tape 14(1) by the first tape feed mechanism 20A, as illustrated in FIG. 9C, the subsequent tape 14(2) is fed in order to drive the second tape feed mechanism 20B to move the leading end portion T of the subsequent tape 14(2) from the second detection position P2 to the first detection position P1. Along with this, the preceding tape 14(1) that has ended the component supply is discharged from the tape feeder 5.

Figure 10:
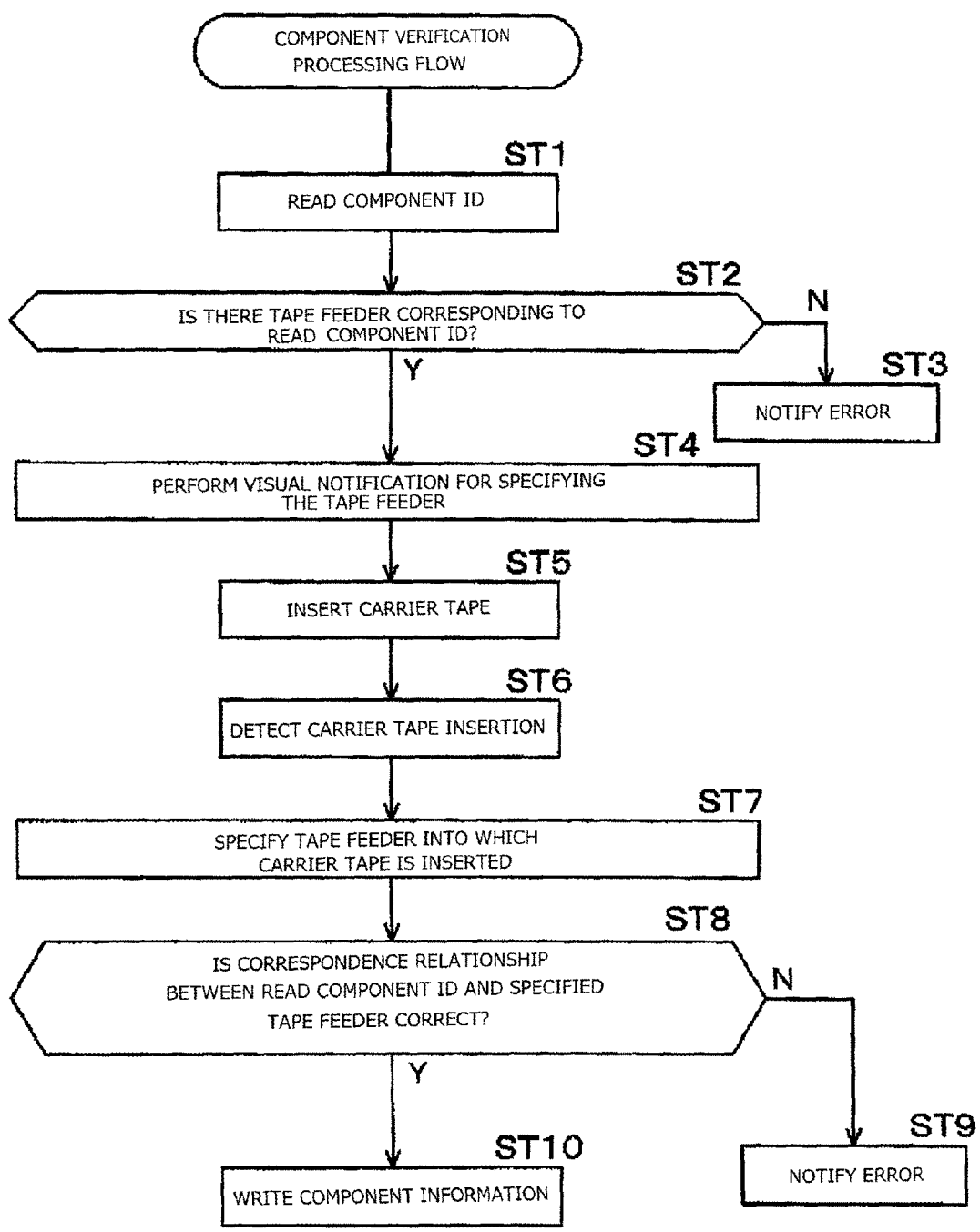
FIG. 10 is a flow chart illustrating component verification processing by a component verification system of the embodiment of the invention.

Next, the component verification processing of verifying whether or not the stored components of the subsequent tape 14(2) subsequently inserted into the tape feeder 5, in a state where the preceding tape 14(1) is mounted, for component replenishment are correct will be described referring to FIGS. 12A to 12C and respective drawings according to the flow of FIGS. 10 and 11.

First, reading of a component ID is performed (Step ST1), and a component ID corresponding to the stored components of the subsequent tape 14(2) are read (component ID reading process). That is, as illustrated in FIG. 5, the worker prepares a new supply reel 13 for replenishment for a tape feeder 5 that requires component replenishment, and operates the bar code reader 16 to read a bar code label L patched on the supply reel 13. The reading result is transmitted to the component mounting apparatus 1 via the host system 30 through wireless communication.

The component verifying unit 34 confirms whether or not there is a tape feeder 5 corresponding to the read component ID, with reference to the mounting data 32a and the component arrangement data 32b (Step ST2). Here, if it is determined that there is no corresponding tape feeder, error notification is performed (Step ST3). That is, as illustrated in FIG. 12A, a message showing "there is no tape feeder into which a tape having the read component ID is to be inserted" is displayed on the notification screen 15a.

When the component ID read in the component ID reading process is correct and there is a corresponding tape feeder in Step ST2, visual notification for specifying a tape feeder 5 is performed (Step ST4). Here, it is visually notified that the tape feeder 5 is the corresponding tape feeder 5 by turning on the notification lamp 26d provided at the operation and display panel 26 of the corresponding tape feeder 5. Next, insertion of a carrier tape 14 is performed (Step ST5). That is, the worker inserts the subsequent tape 14(2) serving as a reading target into the tape feeder 5 serving as a notification target in Step ST4. Next, carrier tape insertion detection is performed (Step ST6). That is, as the subsequent tape 14(2) is inserted into the tape feeder 5, the sprocket 21B of the second tape feed mechanism 20B rotates, and the insertion detecting unit 28a detects the subsequent tape insertion based on the fact that the encoder 23 detects this rotation (tape insertion detecting process).

Next, a tape feeder into which the carrier tape is inserted is specified (Step ST7). That is, by detecting a tape feeder in which tape insertion is detected, the feeder specifying unit 33 specifies the mounting position of the tape feeder in which the insertion of the subsequent tape 14(2) is detected (feeder specifying process). Next, it is verified whether or not the correspondence relationship between the tape feeder specified in this feeder specifying process and the read component ID is correct (Step ST8). That is, the component verifying unit 34 verifies whether or not the correspondence relationship between the read component ID 36a and the mounting position of the specified tape feeder is correct, by referring to the component arrangement data 32b (component verifying process).

Here, when the correspondence relationship is not correct, that is, when tape insertion is performed on a tape feeder 5 on which tape insertion should not be performed, error notification is performed (Step ST9). In this error notification, the fact is visually notified to the display unit 15 that is the notification unit. That is, as illustrated in FIG. 12B, a message 15c showing "a tape feeder into which a tape is inserted is not correct" is displayed on the notification screen 15a. Additionally, when the correspondence relationship between the component ID and the mounting position of the tape feeder is determined to be correct in Step ST8, it is determined that the component verification has been normally performed and component information writing is performed (Step ST10). That is, the component ID 36a is written in the feeder storage unit 36.

Figure 11:
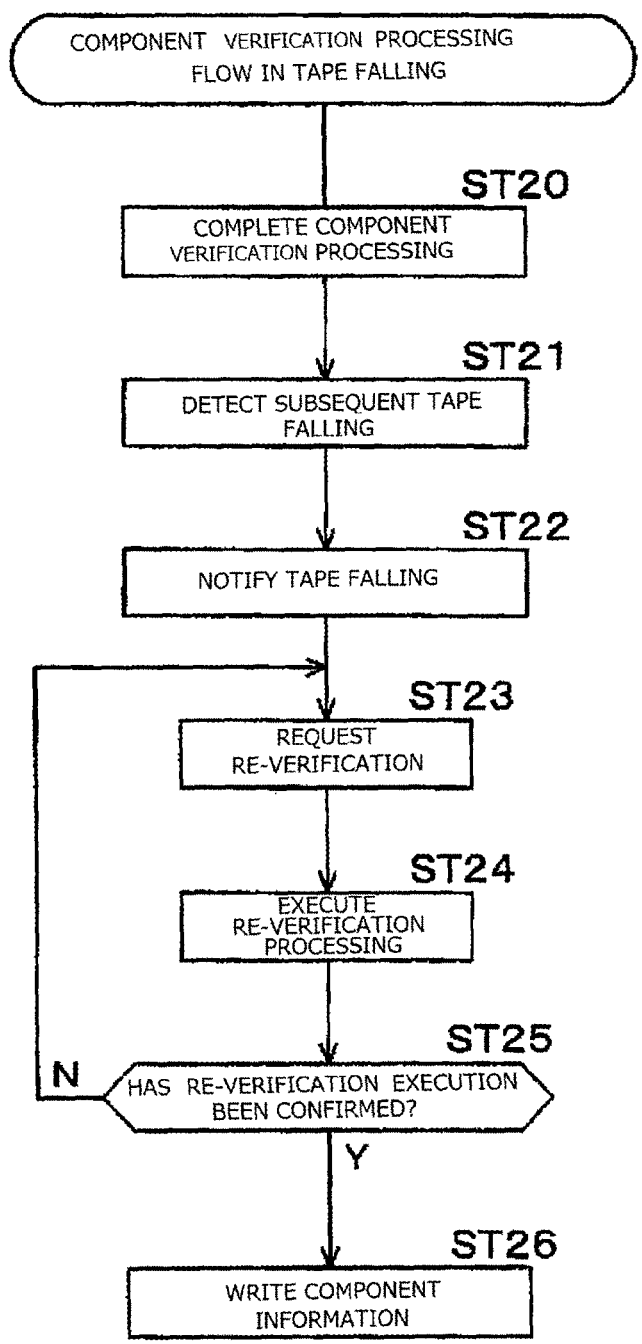
FIG. 11 is a flow chart illustrating component verification processing by the component verification system of the embodiment of the invention.
Figure 12A:
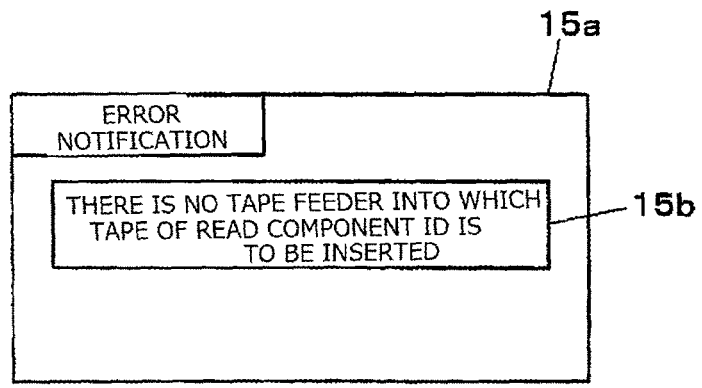
FIGS. 12A to 12C are explanatory views of a notification screen in the component verification processing by the component verification system of the embodiment of the invention.
Figure 12B:
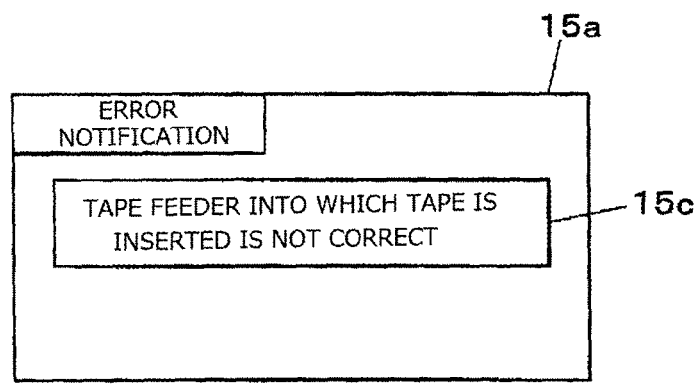

FIG. 11 illustrates component verification processing in tape falling executed when the subsequent tape 14(2) in the state of being once inserted into a tape feeder 5 has fallen from the tape feeder 5, due to a certain cause, such as a worker's carelessness, after the above-described component verification processing is ended. Here, first, the respective steps (Step ST1 to Step ST10) illustrated in the flow of FIG. 10 are completed, and a processing step begins from the state of component verification processing completion (Step ST20) where the component ID 36a is written.

That is, if tape falling occurs after this, the tape falling is determined by the tape falling determining unit 28b that has received a rotation signal from the encoder 23, and the fact is notified to the component mounting apparatus 1 by the tape falling notifying unit 28c. In the component mounting apparatus 1 that has received this notification, it is determined that it is detected that the subsequent tape 14(2) has fallen from the tape feeder (Step ST21) after the component verifying process, the tape falling notification (Step ST22) (tape falling notification process) of notifying the fact is performed, and the re-verification request (Step ST23) of requesting re-execution of the component verification processing illustrated in the flow of FIG. 10 to the worker is performed (re-verification requesting process).

Figure 12C:
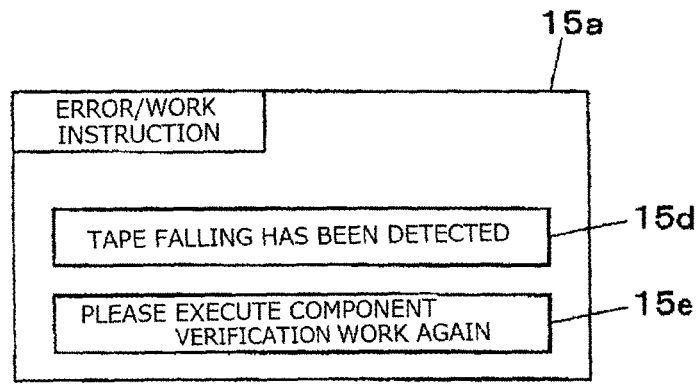

That is, in the display unit 15, as illustrated in FIG. 12C, a tape falling notification message 15d showing that "tape falling has been detected", and a re-verification request message 15e showing "Please execute the component verification work again" are displayed on the notification screen 15a. Then, the worker who has received this re-verification request executes the re-verification processing of repeating the processing illustrated in the flow of FIG. 10 (Step ST24). Then, the fallen subsequent tape 14(2) is re-inserted into the tape feeder 5 after the re-verification processing execution. In this case, the data processing of eliminating the component ID 36a, which was once written in the feeder storage unit 36, is performed (Step ST25). Accordingly, a malfunction caused by wrong component ID being stored and remained as it is can be avoided.

Next, whether or not the re-verification execution has been confirmed is determined through the processing history of the component verifying unit 34 (Step ST25). Here, if the re-verification execution has been confirmed, it is determined that the component verification processing has been normally executed, and the component information writing is performed again (Step ST26). Additionally, when the re-verification processing execution is not confirmed, the processing returns to Step ST23 and the re-verification request is continued. Then, finally, as the re-verification processing execution is confirmed through in Step ST26, the component verification processing in tape falling is ended.

As described above, in the present embodiment, in the component verification processing of verifying whether or not the stored components of the subsequent tape 14(2) subsequently inserted into the tape feeder 5, in a state where the preceding tape 14(1) is mounted, for component replenishment are correct, an artificial operation error produced when the worker inserts the subsequent tape 14(2) can be eliminated by reading the component ID corresponding to the stored components of the subsequent tape 14(2) and detecting that the subsequent tape 14(2) has been inserted into the tape feeder 5, thereby specifying a tape feeder 5 serving as a component verification target, and verifying whether or not the correspondence relationship between the read component ID and the specified tape feeder 5 is correct. Additionally, if it is detected that the subsequent tape 14(2) has fallen from the tape feeder 5 after the component verification, a malfunction resulting from a work error in re-mounting of the fallen subsequent tape 14(2) can be prevented by requesting re-execution of the verification to the worker.

The component verification method and the component verification system of the invention have an effect in which malfunctions resulting from a work error in re-mounting of a fallen subsequent tape can be prevented, and are useful in a component mounting field in which electronic components are taken out from a tape feeder, and are mounted to a substrate.

What is claimed is:

1. A component verification method for verifying whether or not a stored component of a subsequent tape subsequently inserted into a tape feeder, in a state where a preceding tape precedingly sent out of two carrier tapes sequentially sent one after another is set, for component replenishment is correct, in a component mounting apparatus that picks up components, which are supplied from carrier tapes tape-fed by a plurality of tape feeders arrayed in a component supply unit, by a mounting head to mount the components on a substrate, the component verification method comprising:
a component ID reading process of reading a component ID corresponding to the stored component of the subsequent tape;
a tape insertion detecting process of detecting that the subsequent tape has been inserted into the tape feeder;
a feeder specifying process of specifying a tape feeder in which the insertion of the subsequent tape has been detected;
a component verifying process of verifying whether or not a correspondence relationship between the read component ID and the specified tape feeder is correct; and
a re-verification requesting process of requesting re-execution of the verification to a worker if it is detected that the subsequent tape has fallen from the tape feeder after the component verifying process.

2. The component verification method according to claim 1, further comprising
a tape falling notification process of notifying, when it is detected that the subsequent tape has fallen, a fact to that effect.

3. The component verification method according to claim 1,
wherein in the tape insertion detecting process, the subsequent tape insertion is detected by a fact that a sprocket provided in a tape-feed mechanism that tape-feeds the subsequent tape rotates in accordance with the insertion of the subsequent tape.

4. A component verification system for verifying whether or not stored components of a subsequent tape subsequently inserted into a tape feeder, in a state where a preceding tape precedingly sent out of two carrier tapes sequentially sent one after another is mounted, for component replenishment is correct, in a component mounting apparatus that picks up components, which are supplied from carrier tapes tape-fed by a plurality of tape feeders arrayed in a component supply unit, by a mounting head to mount the components on a substrate, the component verification system comprising:
a component ID reading unit that reads a component ID corresponding to the stored component of the subsequent tape;
a tape insertion detecting unit that detects that the subsequent tape has been inserted into the tape feeder;
a feeder specifying unit that specifies a tape feeder in which the insertion of the subsequent tape has been detected;
a component verifying unit that verifies whether or not a correspondence relationship between the read component ID and the specified tape feeder is correct; and
a re-verification requesting unit that requests re-execution of the verification to a worker if it is detected that the subsequent tape has fallen from the tape feeder after the verification.

5. The component verification system according to claim 4, further comprising
 a tape falling notification unit that notifies, when it is detected that the subsequent tape has fallen, a fact to that effect.

6. The component verification system according to claim 4, wherein the tape insertion detecting unit detects the subsequent tape insertion by a fact that a sprocket provided in a tape-feed mechanism that tape-feeds the subsequent tape rotates in accordance with the insertion of the subsequent tape.

* * * * *